United States Patent [19]
Purdom

[11] Patent Number: 5,750,925
[45] Date of Patent: May 12, 1998

[54] FLIGHT CRASH SURVIVABLE STORAGE UNIT WITH BOILER FOR FLIGHT RECORDER MEMORY

[75] Inventor: Gregory W. Purdom, Sarasota, Fla.

[73] Assignee: Loral Fairchild Corp.

[21] Appl. No.: 317,687

[22] Filed: Oct. 5, 1994

[51] Int. Cl.$^6$ ..................................................... H05K 5/00
[52] U.S. Cl. .................................. 174/52.1; 174/52.3
[58] Field of Search ................................ 174/52.1, 52.3, 174/52.2; 220/4.02; 206/501, 502, 408; 361/728; 29/592.1

[56] References Cited

U.S. PATENT DOCUMENTS

| | | | |
|---|---|---|---|
| 5,123,538 | 6/1992 | Groenewegen | 206/521 |
| 5,317,463 | 5/1994 | Lemke et al. | 360/97.02 |
| 5,370,814 | 12/1994 | Salyer | 252/70 |

Primary Examiner—Kristine L. Kincaid
Assistant Examiner—Kristina Soderquist
Attorney, Agent, or Firm—Joseph J. Kaliko

[57] ABSTRACT

An enclosure for protecting a heat sensitive item from high temperatures and shock which includes: (a) an outer housing including an inner cavity for containing at least one heat sensitive item; (b) a thermal insulator located within the inner cavity defining at least a portion of a second interior cavity, with the at least one heat sensitive item being located within the second interior cavity; and (c) a boiler located within the second interior cavity including at least one containment compartment for containing a thermal mass and at least one protective compartment within which the at least one heat sensitive item is located. The invention finds particular utility in the Flight Recorder field where heat sensitive components, such as solid state memories, may be subject to fire and shock often resulting from an aircraft crash. The invention also features a corrosion protection capability which is effective when the item being protected is in close proximity to a source of moisture. Further aspects of the invention are directed to processes for fabricating enclosures of then type contemplated by the invention (a Flight Crash Survival Storage Unit (FCSSU) in the Flight Recorder context), and to a boiler per se for use in a FCSSU of the type contemplated by the invention.

55 Claims, 3 Drawing Sheets

FLIGHT CRASH SURVIVABLE STORAGE UNIT WITH BOILER FOR FLIGHT RECORDER MEMORY

BACKGROUND OF THE INVENTION

1. Field of the Invention

The invention relates generally to methods and apparatus for protecting heat sensitive items, such as solid state memory devices used in a Flight Recorder (FR), from high temperature environments occurring, for example, if a fire should result following an aircraft crash. The invention also relates generally to methods and apparatus for protecting such items from shock damage and the effects of moisture. This is particularly important when the heat sensitive item is an electronic component like the aforementioned solid state memory device.

More particularly, the invention relates to heat shielded enclosures (such as a commercially available Flight Crash Survivable Storage Unit (FCSSU) used in FRs), and processes for fabricating such enclosures, for protecting and preserving a given device or assembly from moisture, shock damage and otherwise destructive high temperatures.

The invention specifically relates to heat shielded enclosures wherein enclosure size and weight is an important consideration. Once again, an example of where such considerations are important is in the on board aircraft FR context.

In the disclosed embodiment of the invention, used to illustrate the principals thereof, a compact, lightweight FCSSU, including a solid state memory unit, is described. The FCSSU is fabricated, in accordance with the teachings of the invention, to incorporate a "boiler" defined herein to mean a multiple (two or more) compartment containment structure which may be used to separate a thermal mass (such as water) from the devices (such as solid state memory devices) being protected. The FCSSU incorporating the aforementioned single boiler design, which will be explained in greater detail hereinafter, protects the memory from thermal mass moisture contamination, the shock associated with an aircraft crash and the heat associated with an ensuing fire, with little or no loss of stored information.

2. Description of the Related Art

Although there are numerous situations in which it is necessary or desirable to protect an item, device or assembly from deleterious exposure to a high temperature environment, shielding the memory device of an aircraft FR system during crash and a fire presents extremely demanding design constraints.

In this regard, in order to preserve flight information supplied to the memory unit by the flight information recorder data acquisition unit during a predetermined time interval immediately prior to an aircraft crash, the memory unit must be configured and arranged to withstand temperatures in excess of 1100° C. (approximately 2000° F.), experienced during a fire while simultaneously being constructed to endure crushing and penetration forces experienced either on impact or during secondary impact with other portions or pieces of the aircraft. Further, the memory unit of a FR system is subject to additional design constraints imposed by considerations generally applicable to aircraft equipment and systems, including constraints relating to size, weight, cost, serviceability and reliability. For example, protecting the memory unit from the deleterious effects of moisture, particularly when the memory is an electronic device, impacts the aforementioned reliability constraint.

Technical advances in the various electronic solid state device arts have led to high capacity electronic memory devices for nonvolatile storage of digitally encoded information with programmable read only field effect transistor devices and bubble memory devices being two types of such memories. Because such devices are small and lightweight and exhibit high reliability, there has been substantial impetus for replacing the magnetic tape transports utilized in older flight recorder system designs with solid state memories.

Because of increasing heat shielding demands, it is desirable to improve upon currently employed device protection techniques such as those involving the (a) mounting a tape transport, or other flight voice or data recorder memory device, within a cavity that is formed by encasing the memory device with a solid material that is a relatively good thermal insulator; and (b) surrounding that assemblage with a protective metal housing. Such techniques do not achieve the desired overall objectives of reduction in memory unit size and weight that might be obtained in flight recorder systems employing semiconductor memory devices such as erasable programmable read only memories; while at the same time providing enhanced protection for such devices against the effects of heat, shock and moisture.

To illustrate the state of the art, reference should be made to (a) U.S. Pat. No. 4,694,119, to Groenewegen, entitled "Heat Shielded Memory Unit For An Aircraft Flight Data Recorder", issued Sep. 15, 1987; (2) U.S. Pat. No. 4,944,401, to Groenewegen, entitled "Crash Survivable Enclosure For Flight Recorder", issued Jul. 31, 1990; and (3) commercially available solid state FR systems, such as the Model A100AS Solid State Cockpit Voice Recorder (SSCVR) system presently manufactured and sold by Loral Data Systems of Sarasota Fla.

The technique for protecting the solid state memory devices incorporated in the Flight Data Recorder described in the illustrative U.S. Pat. No. 4,694,119 patent involves the use of a thermal liner, which is a solid synthetic organic wax, to encapsulate the memory devices. This reference teaches the utilization of heat of fusion (the melting wax) to protect the memory devices. It does not utilize the more efficient technique of utilizing vaporization to keep the memory cool or deal with the problem of protecting the memory from the moisture content of thermal masses that may be used in a vaporization process.

The technique for protecting the solid state memory device incorporated in the FR described in the illustrative U.S. Pat. No. 4,944,401 patent, involves the use of a wax filler in an inner shell. The wax filler acts to support the memory device and further acts as a phase change material (PCM) with a high melting temperature and a high heat of fusion, to perform the function of a heat sink. The inner shell is supported, and the memory enclosed therein further protected against fire and shock, by a closed cell foam thermal liner. This reference, like the U.S. Pat. No. 4,694,119 patent, teaches the utilization of heat of fusion to protect the memory device.

The exemplary Model A100AS Solid State Cockpit Voice Recorder (SSCVR) illustrates the state of the art concept of enclosing a memory module in a water/silica dry powder (a PCM), which has a high latent heat of vaporization and acts as a heat sink for absorbing large quantities of heat following an aircraft crash. The water essentially forms an even but thin coating over the vast surface area of the silica. After the water is evaporated, the remaining silica becomes a good thermal insulator because of its low coefficient of thermal conductivity. The small size and spherical shape of the silica particles allows the absorbs water to freeze and thaw without an apparent density change which could damage the memory device. The water/silica dry powder is also used to cushion the memory modules during an airplane crash.

The Model A100AS also employs a low density closed cell foam which is used to encapsulate the memory device to prevent damage due to shock and vibration. Furthermore, a light weight metal outer enclosure (the outer shell of the FCSSU) is used to protect against crash impact and penetration forces which may occur during an aircraft crash.

The techniques used in the Model A100AS and similar techniques which surround encapsulated chips with a PCM material, are subject to the corrosion effects of the moisture content of the PCM. Furthermore, the PCM used in the illustrative A100AS system is in contact with the exterior wall of the FCSSU and subject to the high heat that can be brought to bear on the exterior of the FCSSU following an aircraft crash and fire.

In view of the state of the art as illustrated hereinabove and the objective of improving memory device protection capabilities in the illustrative FR applications (where safety and performance requirements are increasing), it is desirable to provide methods and apparatus for improving the fire, shock and moisture protection performance of FCSSUs.

It is also desirable to more generally provide methods and apparatus for protecting heat sensitive items from high temperatures, shock and the effects of moisture, independent of the end use of the device that includes the he at sensitive item.

Furthermore, it is desirable to provide methods and apparatus for protecting heat sensitive items from high temperatures, shock and the effects of moisture utilizing protection devices which satisfy the size, weight, cost, strength, serviceability and reliability constraints mentioned hereinbefore, particularly in the context of memory devices used in FR applications.

Still further, particularly in the FR context, it is desirable to provide methods and apparatus for memory device protection which separate thermal mass moisture from the memory device (particularly electronic type devices), and which isolate the thermal mass used from exterior walls of the FCSSU. The desired isolation will prevent the thermal mass used from being wasted and consequently make the thermal mass more efficient.

Further yet, it is desirable to provide an FCSSU that does not require the use of a water resistant thermal insulator; an FCSSU which uses the efficient process of the latent heat of vaporization as the cooling mechanism to reduce the amount of thermal mass required in the FCSSU; and an FCSSU which is structured so as to keep any moisture content of the thermal mass used separated from the devices being protected until such time as a crash occurs.

It is further desirable to provide processes for fabricating heat sensitive device enclosures that incorporate the features for such enclosures referred to hereinabove.

SUMMARY OF THE INVENTION

Accordingly, it is a general object of the invention to provide methods and apparatus for protecting heat sensitive items from high temperatures, shock and the effects of moisture, independent of the end use of the device that includes the heat sensitive item.

It is a further general object of the invention to provide methods and apparatus for protecting heat sensitive items from high temperatures, shock and the effects of moisture utilizing protection devices which satisfy the size, weight, cost, strength, serviceability and reliability constraints mentioned hereinbefore, particularly in the context of memory devices used in FR applications.

A still further general object of the invention is to provide methods and apparatus for heat sensitive item protection which make effective use of any thermal mass used to protect the device and which minimizes the quantity (weight and volume) of the thermal mass required to perform its cooling function.

A specific object of the invention is to improve memory device protection capabilities in FR applications. In particular it is an object of the invention to provide methods and apparatus for improving the fire, shock and moisture protection performance of FCSSUs in particular and FRs in general.

A further specific object of the invention in the FR context is to separate thermal mass moisture from the memory device (particularly electronic type devices), and isolate the thermal mass used from exterior walls of the FCSSU.

Further yet, it is an object of the invention to provide an FCSSU that does not require the use of a water resistant thermal insulator; an FCSSU which uses the efficient process of the latent heat of vaporization as the cooling mechanism to reduce the amount of thermal mass required in the FCSSU; and an FCSSU which is structured so as to keep any moisture content of the thermal mass used separated from the devices being protected until such time as a crash occurs.

Yet another object of the invention is to provide processes for fabricating heat sensitive device enclosures that incorporate the desirable features for such enclosures referred to hereinabove.

According to the invention, which will be described for illustrative purposes only in the context of a novel FCSSU used in a FR (it being understood that the invention is intended to be broad enough in scope to cover other device protection applications as well and be limited only by the scope of the appended claims), the FCSSU employs a "boiler" design, defined hereinbefore to mean a multiple compartment containment structure which is used to separate thermal mass moisture from the devices (e.g., electronics), being protected. Additionally, the boiler design concept allows the thermal mass to be placed close to the items being protected and be kept away from exterior walls of the FCSSU where the greatest amount of heat is experienced after a crash.

The disclosed FCSSU incorporating the boiler design concept protects the memory unit from the long term effects of moisture, such as shorts and opens resulting from corrosion while the FR is in normal service. Other protective features are incorporated into the disclosed FCSSU to protect against the short term effects of moisture that could interfere with device operation while the memory is being protected from the effects of a fire.

Other FCSSU components and design concepts incorporated in preferred embodiments of the invention, such as thermal insulation for protecting the boiler from heat (and shock as well), cable routing preferences to prevent excess heat entering the boiler via cable coupled between the devices being protected and FR components located outside the FCSSU, etc., are disclosed.

Additionally, a novel FR/FCSSU boiler per se is described along with processes for fabricating an FCSSU that includes the preferred boiler structure.

According to one specific embodiment of the invention an enclosure for protecting at least one heat sensitive item from high temperatures, shock and moisture, comprises: (a) an outer housing including an inner cavity for containing at least one heat sensitive item; (b) a thermal insulator located within the inner cavity defining at least a portion of a second interior cavity, with the at least one heat sensitive item being located within the second interior cavity; and (c) a boiler located within the second interior cavity including at least one containment compartment for containing a thermal mass and at least one protective compartment within which the at least one heat sensitive item is located.

According to an alternate embodiment of the invention an enclosure for protecting at least one heat sensitive item from high temperatures, shock and moisture comprises the aforementioned outer housing and boiler combination without requiring the use of the aforementioned thermal insulator.

A still further embodiment of the invention is directed to a flight recorder (e.g., a cockpit voice recorder or flight data recorder), comprising: (a) at least one solid state memory device; (b) a corrosion resistant Flight Crash Survivable Storage Unit (FCSSU) that contains and protects the at least one solid state memory device from shock and fire, wherein the aforementioned FCSSU further includes: (b1) an outer housing including an inner cavity for containing the at least one solid state memory device; (b2) a thermal insulator located within the inner cavity defining at least a portion of a second interior cavity, with the at least one solid state memory device being located within the second interior cavity; and (b3) a boiler located within the second interior cavity wherein the boiler further comprises a containment compartment for containing a thermal mass, a protective compartment within which the at least one solid state memory device is located, and means for interconnecting the containment compartment and the protective compartment wherein the means for interconnecting, when in an open state, provides a passageway between the containment compartment and the protective compartment; and (c) means for sealing the passageway when the means for interconnecting is in a closed state.

Yet another aspect of the invention is directed to a process for fabricating a Flight Crash Survivable Storage Unit (FCSSU) for a Flight Recorder (FR) comprising the steps of: (a) fabricating a boiler that includes a containment compartment for storing a thermal mass and a separate protective compartment for housing an electronic memory device to be protected from heat, moisture and shock; (b) filling the containment compartment with a thermal mass; (c) placing the electronic memory device in the protective compartment; (d) housing the boiler in a covered outer housing that includes, within the covered outer housing, a thermal insulator defining a cavity within which to situate and protect the boiler; (e) providing a cable passageway formed in the first thermal insulator, the cable passageway extending to and thru the covered outer housing; and (f) providing at least one vent tube which exits the protective compartment via at least one passageway formed in the thermal insulator, the at least one passageway extending to and thru the covered outer housing.

A still further aspect of the invention is directed to a boiler per se for a protecting (from heat, shock and moisture) a memory device included in a Flight Recorder (FR), comprising: (a) a first compartment for containing a thermal mass; (b) a second compartment, separate from said first compartment, for containing the memory device being protected; (c) means for interconnecting the first compartment and the second compartment, wherein the means for interconnecting includes a passageway located therebetween; (d) means for sealing off the passageway until the thermal mass is heated to a predetermined temperature; and (e) means for enabling flight information to be input to the memory device to be recorded therein.

The invention features improved heat sensitive item protection capabilities, particularly improved fire protection performance for FRs that include solid state memories. The invention also features corrosion and shock damage protection capabilities; and satisfaction of the aforementioned size, weight, cost, strength, serviceability and reliability constraints, particularly in the FR applications described hereinbefore.

These and other objects, embodiments and features of the present invention and the manner of obtaining them will become apparent to those skilled in the art, and the invention itself will be best understood by reference to the following Detailed Description read in conjunction with the accompanying Drawing.

DETAILED DESCRIPTION

Figure 1A:
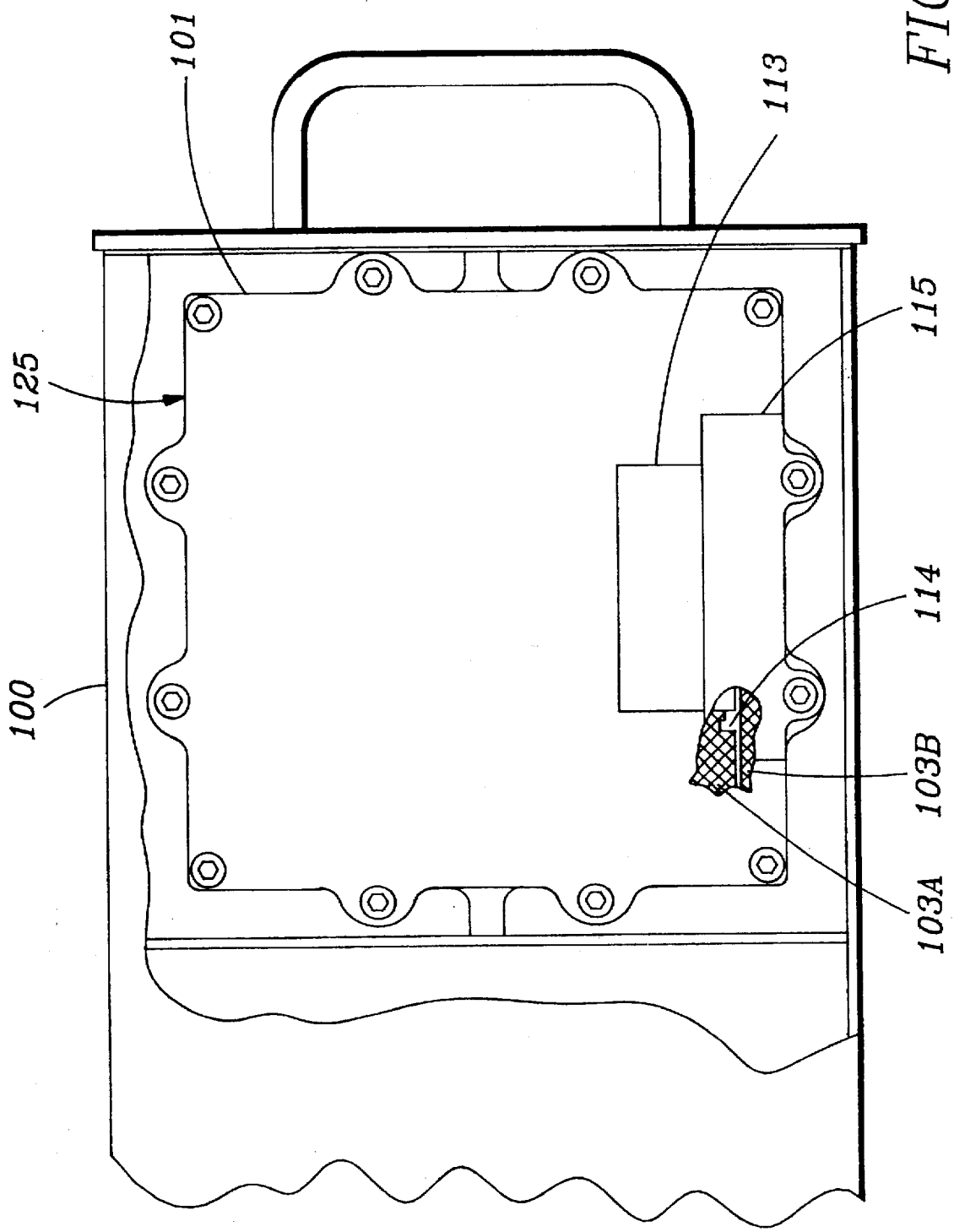
FIG. 1A is a top view of an illustrative Flight Crash Survivable Storage Unit (FCSSU) located in exemplary Flight Recorder.
Figure 1B:
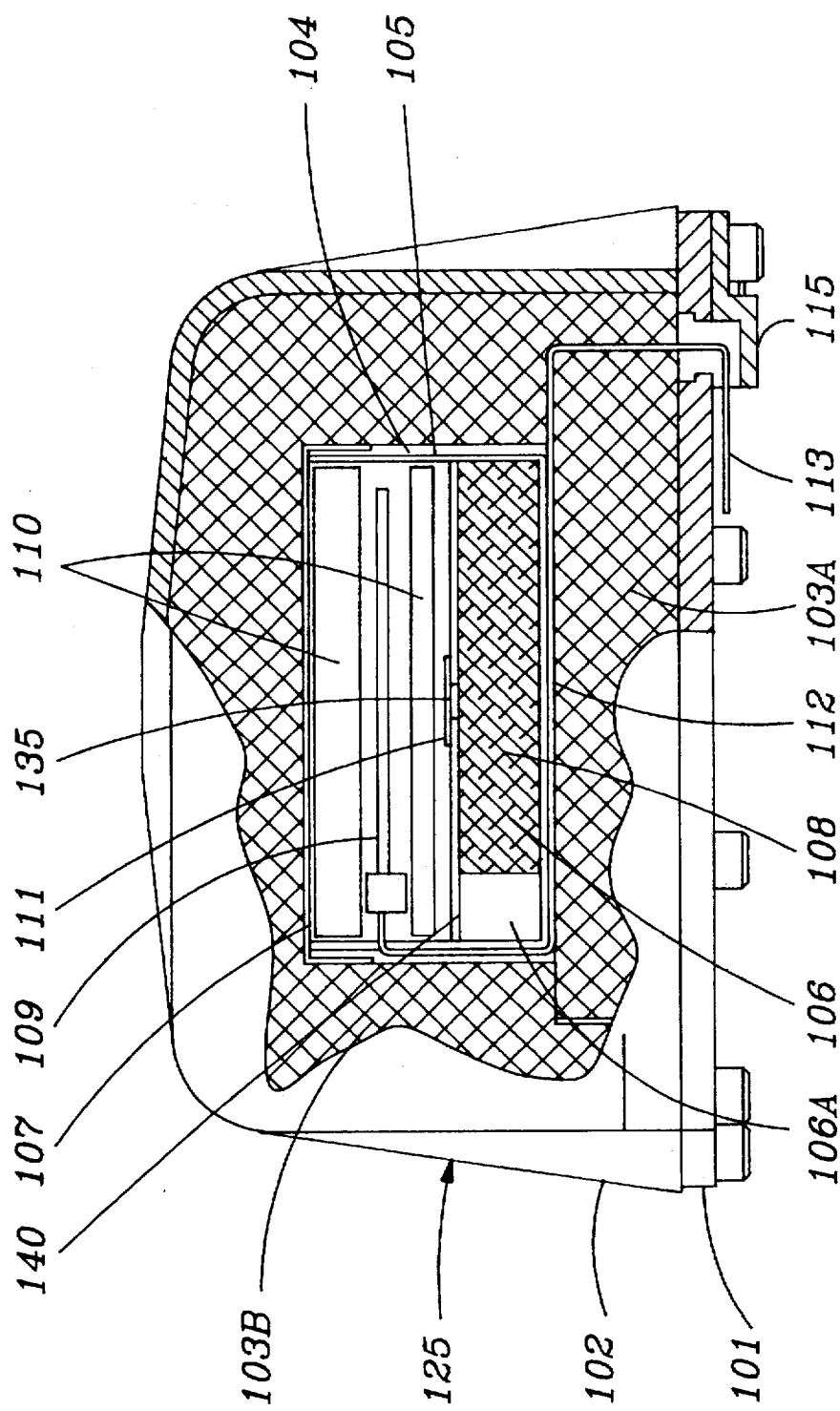
FIG. 1B depicts a partial cross sectional view of the FCSSU depicted in FIG. 1A.
Figure 1C:
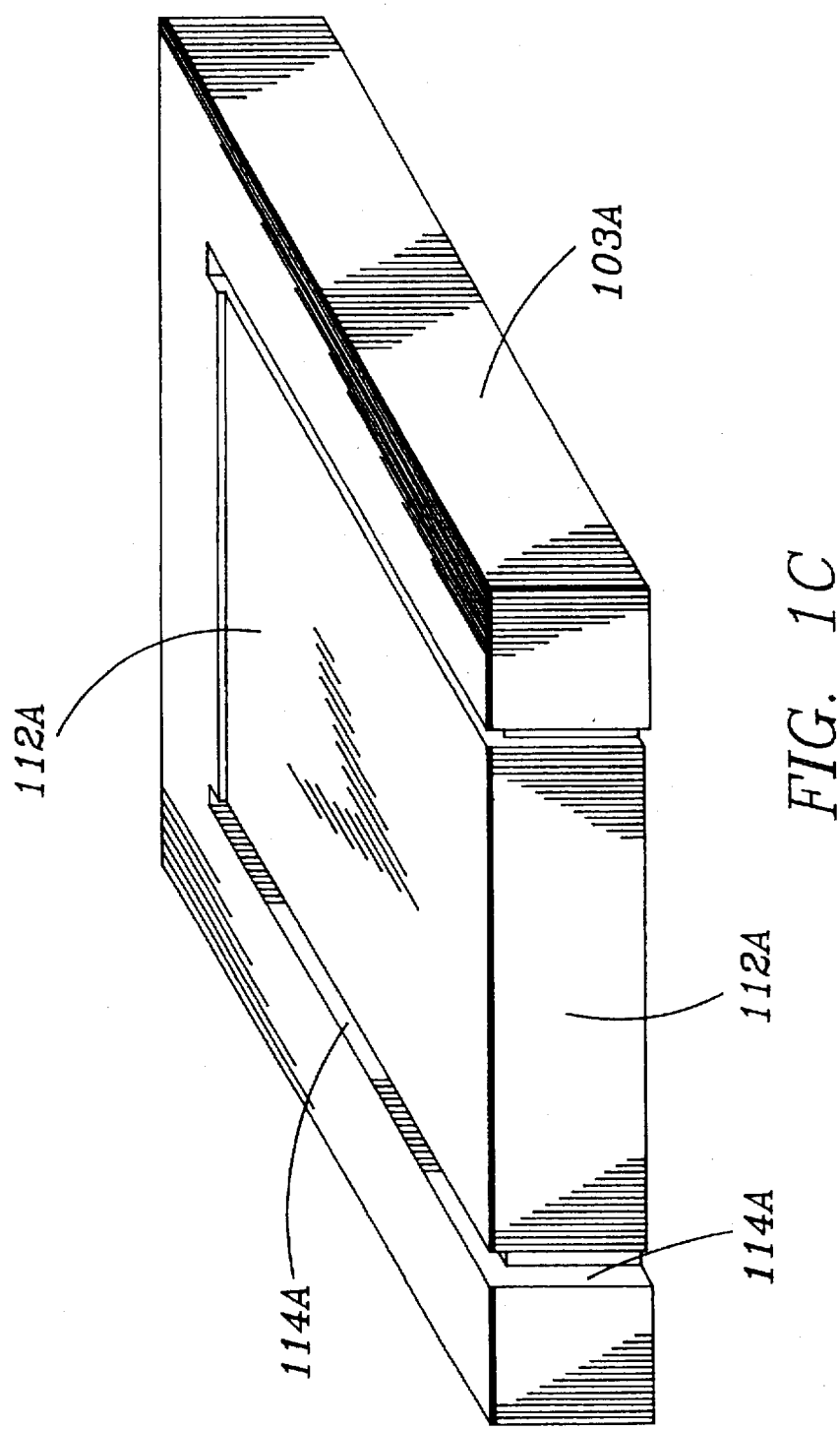
FIG. 1C is an isometric view of underside and cable exit edge of top insulation 103a depicted in FIG. 1B.

As indicated hereinbefore, for the sake of illustration only, the principals of the invention will be described in the context of a FR and FCSSU enclosure located therein, where the FCSSU is constructed in accordance with the teachings of the invention as shown in FIGS. 1A–1C.

Reference should now be made to FIG. 1A and FIG. 1B which both depict illustrative FCSSU 125, with FCSSU 125 being shown installed in FR 100 (in FIG. 1A only). Crash housing cover 101 for FCSSU 125 is also depicted in both FIG. 1A and FIG. 1B. An example of a commercially available device which has an FCSSU installed in a FR as shown in FIG. 1A is the aforementioned Model A100AS SSCVR system presently manufactured and sold by Loral Data Systems of Sarasota Fla.

Also shown in FIG. 1A, located underneath crash housing cover 101; and in FIG. 1B, in cross section within FCSSU 125, is a thermal insulator which, for reasons to be set forth hereinafter, is preferably installed in FCSSU 125 in two pieces. Portions of these two pieces of insulation are shown as (a) top insulation 103a; and (b) bottom insulation 103b. The thermal insulator functions to protect devices from heat and cushion devices from shock, and will be discussed further hereinafter with reference to FIGS. 1B–1C.

FIG. 1A also depicts, located outside the exterior of crash housing cover 101, (a) a portion of cable 113; (b) air passageway 114; and (c) cable exit protector 115, the purpose and function of which will also be explained hereinafter with reference to FIGS. 1B–1C.

As indicated hereinbefore, FIG. 1B depicts a partial cross sectional view of FCSSU 125. FCSSU 125 is shown in FIG. 1B to be a sealed enclosure when crash housing cover 101 and the depicted crash housing 102 are assembled.

According to alternate embodiments of the invention, crash housing cover 101 and crash housing 102 are comprised essentially of titanium (for lightest weight); or of commercially available 17-4PH stainless steel (for greatest strength); with cover 101 and housing 102 being similar to crash housings and covers currently used on the referenced Model A100AS SSCVR. When cover 101 is affixed to housing 102, an outer housing including an inner cavity is formed (as in the Model A100AS SSCVR), within which a heat sensitive item (like solid state memory 109 of FIG. 1B) may be installed and protected.

As indicated hereinbefore, FIG. 1B also depicts a cross sectional view of a thermal insulator shown in two parts. Bottom insulation 103b may be characterized as being located within an inner cavity formed by housing 102, and is further shown to define at least a portion of a second interior cavity (boiler cavity 104), within which a heat sensitive item, like solid state memory 109, may be placed.

FIG. 1B also depicts boiler 105 located within the second interior cavity (boiler cavity 104), including containment compartment 106 (including a thermal expansion cavity 106a), for containing a thermal mass (108); and protective compartment 107 within which the heat sensitive item (the item to be protected) is located.

FIG. 1B illustrates that, in accordance with one embodiment of the invention, the underside of top insulation 103a (shown in FIG. 1C) is formed to include cable channel groove 112a and air passage grooves (like groove 114a), so that when top insulation 103a and bottom insulation 103b are juxtaposed, a cable channel (112) and an air passageway (114 as shown in FIG. 1A) extend from the interior of protective compartment 107, thru the thermal insulation (103a and 103b combined), to and thru cover 101.

Cable 113 may be seen in both FIG. 1A (on the exterior of cover 101), and may also be seen traversing the full extent of the cable channel 112 formed when top and bottom insulation (103a and 103b respectively), are juxtaposed as shown in FIG. 1B. Illustrative air passageway 114, as indicated hereinabove, may be seen with reference to FIG. 1A. Other air passageways may be formed to vent the interior of protective compartment 107 for the reasons to be described hereinafter.

FIG. 1B also depicts padding 110 (shown for the sake of illustration only in two pieces), thermal seal 111, and cable exit protector 115, the purpose and function of which will all be explained hereinafter.

According to a preferred embodiment of the invention, top and bottom insulation 103a and 103b respectively, may be formed using a molded microporous insulation which can stand the high temperatures which may exist on this inside surface of FCSSU 125. An example of a suitable material which may be formed as shown in FIG. 1C (or in alternative forms accomplishing similar functions) is commercially available from the Manville Specialty Insulation group of Schuller, which is known to perform well in this type of environment.

Boiler 105 is, according to the teachings of a preferred embodiment of the invention, a dual cavity metallic container isolated from cover 101 and housing 102 by top insulation 103a and bottom insulation 103b. One cavity (e.g., 106, referred to hereinbefore) contains a thermal mass (108), e.g., a phase change material, to absorb heat and maintain a constant temperature; and the other cavity (e.g., 107, referred to hereinbefore) contains the heat sensitive item (like solid state memory 109) which is to be protected during an aircraft crash.

Thermal mass 108 preferably is, but does not have to be, a phase change material. According to a preferred embodiment of the invention the thermal mass will operate most efficiently if it utilizes the energy absorption from vaporization to absorb heat. A suitable exemplary PCM meeting this criteria is water.

According to a one embodiment of the invention, the water is contained in a dry material which inhibits the water from freezing or expanding. Such materials include (for example) sponge, silica, polyacrylamide, calcium silicate or pottery clay. It should be noted that containment compartment 106 (for containing a thermal mass (108)), is shown to include the aforementioned thermal expansion cavity 106a to accommodate expansion of the contained thermal mass.

Particularly well suited for use in the FR context is a dry powder thermal mass formed by combining water and silica, or a gel formed by combining water and polyacrylamide. The thermal mass created from such compositions inherently absorb shock which provides additional protection for sensitive component located within boiler 105.

As indicated hereinbefore, boiler 105 is further shown to include thermal seal 111 which seals (and may be thought of as part of) means for interconnecting containment compartment 106 and protective compartment 107. The means for interconnecting the compartments is further illustrated in FIG. 1B as a passageway 135 shown located between the compartments 106 and 107, through interior boiler wall 140.

Thermal seal 111, according to a preferred embodiment of the invention, is designed to seal off passageway 135 until thermal mass 108 (located in containment compartment 106) is heated to a predetermined temperature (e.g., 100° C. when water is used as the thermal mass).

Thermal seal 111 may, for example, be realized by one or more thermal vent plugs which are released at a predetermined temperature. Examples of suitable materials to use for such plugs are wax, paraffin, a bismuth alloy or electrical solder.

Alternatively, thermal seal 111 may (as illustrated in FIG. 1B) comprise a disc (shown in cross section in FIG. 1B, located in protective compartment 107), which is affixed with an adhesive to interior wall 140 of boiler 105. The disc could, for example, be a metallic seal. According to one embodiment of the invention, the adhesive releases thermal seal 111 at a predefined temperature opening passageway 135 between containment compartment 106 and protective compartment 107.

In operation, the thermal vent plug(s) or other type of seal used, eventually blow out (or melt) when, for example the thermal mass (assumed hereinafter, for the sake of illustration only, to be water), nears its boiling point. According to the illustrative embodiment of the invention (with water as the thermal mass), when thermal seal 111 is released, water and/or steam is allowed to enter protective compartment 107 (which contains the item(s) to be protected).

Furthermore, according to the illustrative embodiment of the invention, the steam will cause the temperature in protective compartment 107 to remain within a predetermined desirable range (approximately 100° C. when steam enters protective compartment 107), and allow the items being protected to continue to operate in a safe manner, only if a proper sized exhaust is provided from protective compartment 107.

This may be accomplished by proper sizing of the aforementioned air passageways (like air passageway 114) from the inside of protective compartment 107, thru the thermal insulator, to the exterior of FCSSU 125. Ideally, the air passageway vent(s) allow the steam to slowly escape from protective compartment 107 to the area outside FCSSU 125. The expansion of water when it changes to steam would other wise create a tremendous pressure which could cause damage to the items contained in containment compartment 107 and damage to the compartment itself. The boiling point temperature would also rise and might cause thermal damage to the items (e.g.,electronics) contained therein.

Thus it may be seen that, according to a preferred embodiment of the invention, air passageway 114 is ideally sized to release pressure from protective compartment 107 while maintaining the temperature within protective compartment 107 within a predefined range.

It should also be noted that according to a preferred embodiment of the invention, as shown in FIG. 1B, cable path 112 runs adjacent to at least a portion of an exterior wall of boiler 105. This will allow cable 113 to be thermally bonded to the exterior boiler wall if desired.

By allowing cable 113 to be thermally bonded to (or otherwise pass in close contact with) the outer surface of the walls of boiler 105, some of the heat which conducts along the wires of the cable (e.g., heat conducted from outside of FCSSU 125 by, for example, copper wiring), may be kept from directly reaching the interior of protective compartment 107. More particularly the undesirable heat may be kept from damaging the item or items (such as, for example, printed circuit boards) to which cable 113 is connected if the cable is routed as shown in FIG. 1B.

Further steps can be taken to minimize the amount of heat that may be conducted inwardly by cable 113. For example, those skilled in the art will readily appreciate that the cross section area of the conductors of cable 113, to the outside of FCSSU 125, should be minimized to reduce heat conduction.

FIG. 1A and FIG. 1B also depict cable protector 115 which is designed to protect the cable 113 exit from FCSSU 125 from being penetrated. Cable protector 115 is preferable made from the same material as cover 101 and housing 102 (e.g., titanium, stainless steel, etc.).

Finally, the items to be protected within protective compartment 107 may be coated or encapsulated within a variety of materials, well known to those skilled in the art, to provide further protection for against heat, moisture and shock. For example, rubber padding (shown as the previously mentioned padding 110 in FIG. 1B), will provide additional protection for depicted solid state memory 109 against shock damage, the aforementioned coating of chips with a foam (discussed in the context of the referenced Model A100AS SSCVR which employs a low density closed cell foam to encapsulate memory devices), prevents damage due to shock and vibration, etc.

As indicated hereinbefore, it should be noted that a further aspect of the invention is directed to processes for fabricating enclosures of the type depicted in FIG. 1B. For the sake of illustration only, without intending to limit the scope of the invention, a description of one such process will be set forth hereinafter.

The first step of the illustrative process is that of fabricating a boiler that includes a containment compartment for storing a thermal mass and further includes a separate protective compartment for housing a device to be protected from heat, moisture and shock.

The step of fabricating such a boiler may, for example, be accomplished by welding together two deep drawn cans to form the containment compartment and the protective compartment. Alternatively, the aforementioned components may be formed by dip brazing metallic components. Further steps to produce a boiler of the type depicted in FIG. 1B include the step of creating at least one passageway between the containment compartment and the protective compartment to allow the containment compartment of the boiler to be filled with a thermal mass; and sealing the at least one passageway with a thermal plug that releases its seal at a predetermined temperature, after first filling the containment compartment with a desired thermal mass.

Next, the device(s) to be protected could be placed in the protective compartment; and the boiler could then be sealed and be housed within a covered outer housing that includes, a thermal insulator defining a cavity within which to situate and protect the boiler.

Further steps for fabricating the illustrative FCSSU (not necessarily performed in the following order) include providing a cable passageway formed in that thermal insulator, with the cable passageway extending to and thru the covered outer housing; and providing at least one vent tube which exits the protective compartment via at least one passageway formed in the thermal insulator, where the at least one passageway also extends to and thru the covered outer housing.

As indicated hereinbefore, a preferred embodiment of the invention calls for the cable passageway to run adjacent to at least a portion of an exterior wall of the boiler.

Further steps of the illustrative process include thermally bonding a cable placed in the cable passageway to at least a portion of an exterior wall of the boiler; appropriately sizing the vent tube to allow the release of pressure from the protective compartment while maintaining the temperature within the protective compartment within a predefined range; and performing the aforementioned step of sealing by affixing a metallic seal with a sealing agent, such as an adhesive to an interior wall of the boiler, solder, etc.; wherein the sealing agent releases the seal at a predefined temperature.

Having described an illustrative process for fabricating a FCSSU of the type depicted in FIG. 1B, those skilled in the art will recognize that many variations are possible without departing from the spirit or scope of the invention.

Finally, a further aspect of the invention is directed to a boiler per se (for example, boiler 105 depicted in FIG. 1B), for a protecting a memory device, included in a Flight Recorder (FR), from heat, shock and moisture. The boiler may be characterized (with all numerals referring to FIG. 1B) as including a first compartment (106) for containing a thermal mass (108); a second compartment (107), separate from the first compartment, for containing the memory device being protected (109); means for interconnecting (the combination of 135 and 111) the first compartment and the second compartment, wherein the means for interconnecting includes a passageway (135) located therebetween; means for sealing (111) off said passageway until the thermal mass is heated to a predetermined temperature; and means for enabling flight information to be input (113) to the memory device to be recorded therein.

What has been described in detail hereinabove are methods and apparatus meeting all of the aforestated objectives. As previously indicated, those skilled in the art will recognize that the foregoing description has been presented for the sake of illustration and description only. It is not intended to be exhaustive or to limit the invention to the precise form disclosed, and obviously many modifications and variations are possible in light of the above teaching.

For example, the methods and apparatus described herein were presented in the context of an FCSSU used in FR applications. As indicated hereinbefore, those skilled in the art will readily appreciate that such methods and apparatus are well suited for the protection of other heat sensitive items used in any number of applications.

The embodiments and examples set forth herein were presented in order to best explain the principles of the instant invention and its practical application to thereby enable others skilled in the art to best utilize the instant invention in various embodiments and with various modifications as are suited to the particular use contemplated.

It is, therefore, to be understood that the claims appended hereto are intended to cover all such modifications and variations which fall within the true scope and spirit of the invention.

What is claimed is:

1. An enclosure for protecting at least one heat sensitive item from high temperature, shock and moisture, said enclosure comprising:

(a) an outer housing including an inner cavity for containing at least one heat sensitive item;
   (b) a cover for said outer housing;
   (c) a thermal insulator located within said inner cavity defining at least a portion of a second interior cavity, with said at least one heat sensitive item being located within said second inner cavity;
   (d) a boiler located within said second interior cavity including at least one containment compartment for containing a thermal mass, at least one protective compartment within which said at least one heat sensitive item is located and means for interconnecting said at least one containment compartment and said at least one protective compartment, wherein said means for interconnecting, when open, provides a passageway between said at least one containment compartment and said at least one protective compartment; and
   (e) at least one vent tube which exits said at least one protective compartment via at least one passageway formed in said thermal insulator, said at least one passageway extending to and thru the cover for said outer housing.

2. Apparatus as set forth in claim 1 wherein said outer housing is metallic.

3. Apparatus as set forth in claim 1 wherein said outer housing consists essentially of titanium.

4. Apparatus as set forth in claim 1 wherein said outer housing consists essentially of stainless steel.

5. Apparatus as set forth in claim 1 wherein said thermal insulator consists essentially of a dry microporous insulating material.

6. Apparatus as set forth in claim 1 wherein said boiler is a dual cavity metallic container.

7. Apparatus as set forth in claim 1 wherein said thermal mass includes a phase change material (PCM).

8. Apparatus as set forth in claim 7 wherein said PCM utilizes the energy absorption from vaporization to absorb heat.

9. Apparatus as set forth in claim 7 wherein said PCM is water.

10. Apparatus as set forth in claim 9 wherein said water is contained in a dry material which inhibits the water from freezing or expanding.

11. Apparatus as set forth in claim 10 wherein said dry material comprises sponge, silica, polyacrylamide, calcium silicate or pottery clay.

12. Apparatus as set forth in claim 7 wherein said thermal mass is a dry powder formed by combining water and silica.

13. Apparatus as set forth in claim 1 wherein said thermal mass absorbs shock.

14. Apparatus as set forth in claim 13 wherein said thermal mass is a gel formed by combining water and polyacrylamide.

15. Apparatus as set forth in claim 1 further comprising means for sealing off said passageway until said thermal mass is heated to a predetermined temperature.

16. Apparatus as set forth in claim 5 wherein said means for sealing further comprises at least one thermal vent plug which is released at said predetermined temperature.

17. Apparatus as set forth in claim 16 wherein said at least one thermal vent plug comprises wax, paraffin, a bismuth alloy or electrical solder.

18. Apparatus as set forth in claim 16 wherein said at least one thermal vent plug comprises a metallic seal which is affixed with a sealing agent to an interior wall of said boiler, wherein said sealing agent releases said seal at said predetermined temperature.

19. Apparatus as set forth in claim 1 further comprising a cable which exits said at least one protective compartment via a passageway formed in said thermal insulator, said passageway extending to and thru the cover for said outer housing, wherein said passageway runs adjacent to at least a portion of an exterior wall of said boiler.

20. Apparatus as set forth in claim 19 wherein said cable is thermally bonded to at least a portion of said exterior wall of said boiler.

21. Apparatus as set forth in claim 1 wherein said at least one passageway is sized to release pressure from said at least one protective compartment while maintaining the temperature within said at least one protective compartment within a predefined range.

22. Apparatus as set forth in claim 1 wherein said at least one heat sensitive item is coated with a material which protects said item from moisture.

23. Apparatus as set forth in claim 1 wherein said at least one heat sensitive item includes a solid state memory device.

24. Apparatus as set forth in claim 1 wherein said thermal insulator protects said boiler and said at least one heat sensitive item contained therein from shock.

25. Apparatus as set forth in claim 24 wherein said at least one protective compartment includes padding for further protecting said at least one heat sensitive item from shock.

26. An enclosure for protecting at least one heat sensitive item from high temperature, shock and moisture, said enclosure comprising:

(a) an outer housing including an inner cavity for containing at least one heat sensitive item;
   (b) a cover for said outer housing;
   (c) a boiler located within said inner cavity including at least a first containment compartment for containing a thermal mass, at least one protective compartment within which said at least one heat sensitive item is located;
   (d) means for interconnecting said at least a first containment compartment and said at least one protective compartment, wherein said means for interconnecting, when open, provides a passageway between said first containment compartment and said at least one protective compartment and said at least one protective compartment; and
   (e) at least one vent tube which exits said at least one protective compartment via at least one passageway extending to and thru the cover for said outer housing.

27. Apparatus as set forth in claim 26 wherein said at least one passageway is sized to release pressure from said at least one protective compartment while maintaining the temperature within said protective compartment within a predefined range.

28. A flight recorder, comprising:

(a) at least one solid state memory device;
   (b) a corrosion resistant Flight Crash Survivable Storage Unit (FCSSU) that contains and protects said at least one solid state memory device from shock and fire, wherein said FCSSU includes:

(b1) an outer housing including an inner cavity for containing at least one solid state memory device;

(b2) a cover for said outer housing;

(b3) a thermal insulator located within said inner cavity defining at least a portion of a second interior cavity, with said at least one solid state memory device being located within said second inner cavity;

(b4) a boiler located within said second interior cavity wherein said boiler further comprises a containment compartment for containing a thermal mass, a protective compartment within which said at least one solid state memory device is located, and means for interconnecting said containment compartment and said protective compartment, wherein said means for interconnecting, when open, provides a passageway between said containment compartment and said protective compartment;

(c) means for sealing said passageway when said means for interconnecting is in a closed state; and (d) at least one vent tube which exits said protective compartment via at least one passageway formed in said thermal insulator, said at least one passageway extending to and thru the cover for said outer housing.

29. Apparatus as set forth in claim 28 wherein said outer housing is metallic and is comprised further of titanium or stainless steel.

30. Apparatus as set forth in claim 28 wherein said thermal insulator consists essentially of a dry microporous insulating material.

31. Apparatus as set forth in claim 28 wherein said boiler is a dual cavity metallic container that in said containment compartment stores a thermal mass that includes a phase change material (PCM).

32. Apparatus as set forth in claim 31 wherein said PCM utilizes the energy absorption from vaporization to absorb heat.

33. Apparatus as set forth in claim 31 wherein said PCM is water.

34. Apparatus as set forth in claim 33 wherein said water is contained in a dry material which inhibits the water from freezing or expanding.

35. Apparatus as set forth in claim 34 wherein said dry material comprises sponge, silica, polyacrylamide, calcium silicate or pottery clay.

36. Apparatus as set forth in claim 28 wherein said thermal mass is a dry powder formed by combining water and silica.

37. Apparatus as set forth in claim 28 wherein said thermal mass absorbs shock.

38. Apparatus as set forth in claim 37 wherein said thermal mass is a gel formed by combining water and polyacrylamide.

39. Apparatus as set forth in claim 28 wherein said means for interconnecting is in a said closed state until said thermal mass is heated to a predetermined temperature whereupon said means for interconnecting enters an open state.

40. Apparatus as set forth in claim 39 wherein said means for sealing further comprises at least one thermal vent plug which is released at said predetermined temperature.

41. Apparatus as set forth in claim 40 wherein said at least one thermal vent plug comprises wax, paraffin, a bismuth alloy or electrical solder.

42. Apparatus as set forth in claim 40 wherein said at least one thermal vent plug comprises a metallic seal which is affixed with a sealing agent to an interior wall of said boiler, wherein said sealing agent releases said seal at said predetermined temperature.

43. Apparatus as set forth in claim 42 further comprising a cable which exits said protective compartment via a cable passageway formed in said thermal insulator, said cable passageway extending to and thru the cover for said outer housing, wherein said cable passageway runs adjacent to at least a portion of an exterior wall of said boiler.

44. Apparatus as set forth in claim 43 wherein said cable is thermally bonded to at least a portion of said exterior wall of said boiler.

45. Apparatus as set forth in claim 28 wherein said at least one passageway is sized to release pressure from said protective compartment while maintaining the temperature within said protective compartment within a predefined range.

46. Apparatus as set forth in claim 28 wherein said at least one solid state memory device is coated with a material which protects said device from moisture.

47. Apparatus as set forth in claim 28 wherein said thermal insulator protects said boiler and said at least one solid state memory device contained therein from shock.

48. Apparatus as set forth in claim 47 wherein said protective compartment includes padding for further protecting said solid state memory device from shock.

49. A process for fabricating a Flight Crash Survivable Storage Unit (FCSSU) for a Flight Recorder (FR) comprising the steps of:

(a) fabricating a boiler that includes a containment compartment for storing a thermal mass and a separate protective compartment for housing an electronic memory device to be protected from heat, moisture and shock;

(b) filling said containment compartment with a thermal mass;

(c) placing said electronic memory device in said protective compartment;

(d) housing said boiler in a covered outer housing that includes, within said covered outer housing, a thermal insulator defining a cavity within which to situate and protect said boiler;

(e) providing a cable passageway formed in said thermal insulator, said cable passageway extending to and thru said covered outer housing; and (f) providing at least one vent tube which exits said protective compartment via at least one passageway formed in said thermal insulator, said at least one passageway extending to and thru said covered outer housing.

50. A process as set forth in claim 49 wherein said cable passageway runs adjacent to at least a portion of an exterior wall of said boiler.

51. A process as set forth in claim 50 further comprising the step of thermally bonding a cable placed in said cable passageway to at least a portion of said exterior wall of said boiler.

52. A process as set forth in claim 49 wherein said at least one passageway is sized to release pressure from said protective compartment while maintaining the temperature within said protective compartment within a predefined range.

53. A process as set forth in claim 49 wherein said step of fabricating a boiler further comprises the steps of:

(a) welding together two deep drawn cans to form said containment compartment and said protective compartment;

(b) creating at least one passageway between said containment compartment and said protective compartment to allow the protective compartment of said boiler to be filled with a thermal mass; and (c) sealing said at least one passageway with a thermal plug that releases its seal at a predetermined temperature.

54. A process as set forth in claim 53 wherein said step of sealing is performed by affixing a metallic seal with a sealing agent to an interior wall of said boiler, wherein said sealing agent releases said seal at a predefined temperature.

55. A process as set forth in claim 49 wherein said step of fabricating a boiler further comprises the steps of:

(a) forming said containment compartment and said protective compartment by dip brazing metallic component;

(b) creating at least one passageway between said containment compartment and said protective compartment to allow the protective compartment of said boiler to be filled with a thermal mass; and (c) sealing said at least one passageway with a thermal plug that releases its seal at a predetermined temperature.

* * * * *